United States Patent
Ramesh et al.

(10) Patent No.: US 6,642,539 B2
(45) Date of Patent: Nov. 4, 2003

(54) EPITAXIAL TEMPLATE AND BARRIER FOR THE INTEGRATION OF FUNCTIONAL THIN FILM METAL OXIDE HETEROSTRUCTURES ON SILICON

(75) Inventors: Ramamoorthy Ramesh, Silver Spring, MD (US); Darrell G. Schlom, State College, PA (US)

(73) Assignees: University of Maryland, College Park, MD (US); The Penn State Research Foundation, University Park, PA (US)

( * ) Notice: Subject to any disclaimer, the term of this patent is extended or adjusted under 35 U.S.C. 154(b) by 0 days.

(21) Appl. No.: 10/231,401

(22) Filed: Aug. 29, 2002

(65) Prior Publication Data

US 2003/0062553 A1 Apr. 3, 2003

Related U.S. Application Data

(63) Continuation-in-part of application No. PCT/US01/27050, filed on Aug. 30, 2001, which is a continuation-in-part of application No. 09/652,798, filed on Aug. 31, 2000.

(51) Int. Cl.[7] .................. H01L 29/12; H01L 29/76; H01L 29/94; H01L 31/062; H01L 31/113
(52) U.S. Cl. ................. 257/43; 257/289; 257/613
(58) Field of Search ................ 257/43, 289, 295, 257/296, 613

(56) References Cited

U.S. PATENT DOCUMENTS

| | | | | | |
|---|---|---|---|---|---|
| 5,225,031 A | * | 7/1993 | McKee et al. | ............... | 428/471 |
| 5,270,298 A | * | 12/1993 | Ramesh | ....................... | 505/238 |
| 5,777,356 A | * | 7/1998 | Dhote et al. | ................. | 257/295 |
| 5,830,270 A | * | 11/1998 | McKee et al. | ............... | 117/106 |

* cited by examiner

Primary Examiner—Ngân V. Ngô
(74) Attorney, Agent, or Firm—Charles S. Guenzer

(57) ABSTRACT

A ferroelectric memory cell formed on a monocrystalline silicon underlayer, either an epitaxial silicon contact plug to a transistor source or drain or silicon gate region for which the memory cell forms a non-volatile gate. A conductive barrier layer of doped strontium titanate, whether cationically substituted, such by lanthanum or niobium for strontium and titanium respectively, or anionically deficient, is epitaxially grown over the silicon, and a lower metal oxide electrode layer, a ferroelectric layer and an upper metal oxide electrode layer are epitaxially grown on the barrier layer. No platinum barrier is needed beneath the ferroelectric stack. The invention can be applied to many other functional oxide materials of the Ruddlesden-Popper and devices including micromachined electromechanical (MEM) devices and ferromagnetic tri-layer devices.

32 Claims, 6 Drawing Sheets

EPITAXIAL TEMPLATE AND BARRIER FOR THE INTEGRATION OF FUNCTIONAL THIN FILM METAL OXIDE HETEROSTRUCTURES ON SILICON

RELATED APPLICATIONS

This application is a continuation in part of international application Serial No. PCT/US01/27050, filed Aug. 30, 2001 and published in English as WO 02/19389 A2, which is a continuation in part of Ser. No. 09/652,798, filed Aug. 31, 2000, both incorporated herein by reference in their entireties.

FIELD OF THE INVENTION

The invention relates generally to thin film devices having a functional metal oxide layer, for example, a perovskite ferroelectric memory or high dielectric constant capacitor material. In particular, the invention relates to forming such thin film devices on silicon substrates.

BACKGROUND ART

Significant advancements have been accomplished in the past few years in the growth and processing of ferroelectric and high dielectric metal oxide thin films for a variety of microelectronic applications. Much of the work has focused on potential integration of these metal oxide films into volatile and non-volatile memories although other applications are also being explored. These efforts blossomed in the early 1980s primarily through pioneering efforts in the sol-gel processing, chemical vapor deposition (CVD), and sputter deposition of multi-component metal oxide thin films. These techniques facilitated the fabrication of submicron thin films of ferroelectric materials such as lead zirconate titanate (PZT) and other cationically substituted derivatives of PZT on silicon substrates. Applications other than memories include cuprate thin films for superconducting junctions and microwave devices and magnetic perovskites for magneto transport devices.

The prototypical structure for a high-density non-volatile memory cell that has evolved from these efforts is schematically illustrated in FIG. 1, but other structures are available. A large number of memory cells, one of which is illustrated, are formed in a silicon substrate 10. Ion implantation is used to dope a source 12 and drain 14 into the substrate 10. A pass gate transistor structure including a gate oxide 16 and metallization 18 is formed over the gate region between the source 12 and drain 14 to produce a MOS transistor. Electrical power or sensing circuitry is selectively connected to the source 12 by an unillustrated line and is gated by the signal applied to the gate structure through the metallization 18. The transistor structure is then covered with a first-level dielectric layer 20 typically of $SiO_2$ or a related silicate glass. A contact hole is etched in the oxide dielectric layer 20 over the transistor drain. Polycrystalline silicon is filled into the contact hole to form a silicon plug 22 making electric contact with the transistor drain 14.

The ferroelectric device, in this case, a ferroelectric memory capacitor, is formed over the polysilicon plug 22. The vertically oriented capacitor is electrically contacted at its bottom through the polysilicon plug 22 and silicon drain 14 of the transistor structure and at its more exposed top by a second signal line. The dramatic difference in chemistries between the ferroelectric oxides and the underlying silicon necessitates the introduction of a diffusion barrier to eliminate any diffusion of oxygen from the metal oxide ferroelectric layer or other oxide layers to the components of the semiconductor transistor. Even the oxidation of the top of the silicon plug 22 would create a insulative electrical barrier of $SiO_2$ between the ferroelectric capacitor cell and the silicon transistor. The fact that the barrier must be a good electrical conductor and form an ohmic contact to silicon further complicates the selection of barrier materials.

For reasons to be discussed immediately below, a typical barrier consists of a layer 24 of titanium nitride (TiN) and a layer 26 of platinum immediately underlying a lower electrode layer 28. These layers 24, 26, 28 are patterned to form a lower ferroelectric stack. A shaped diffusion barrier layer 30, for example, of titanium oxide ($TiO_2$) is deposited and patterned to have an aperture over the top of the lower ferroelectric stack. A ferroelectric layer 32 is then deposited, for example of PZT or its generalization of lead lanthanum niobate zirconate titanate (PLNZT), followed by an upper electrode layer 34, and an upper platinum barrier layer 36. The $TiO_2$ diffusion barrier layer 30, the ferroelectric layer 32, the upper electrode layer 36, and the upper platinum barrier layer 34 are patterned to have larger area than that of the aperture over the lower ferroelectric stack. These depositions complete the ferroelectric stack.

An $SiO_2$ inter-level dielectric layer 38 is deposited and patterned to have a via hole overlying the upper platinum electrode layer 36 of the ferroelectric stack. A contact barrier layer 40, for example of conductive TiN or TiW, is coated at the bottom of the via hole, and a metallization 42, for example, of aluminum or tungsten, is filled into the remainder of the via hole, thereby providing an upper electrical contact to the ferroelectric stack.

Platinum is chosen for the barrier, particularly the lower barrier, primarily because of its refractory nature and resistance to oxidation, unlike, for example, the more commonly used conductor aluminum. Platinum barriers enable ferroelectric capacitors with very desirable basic properties, such as large values of remanent polarization AP, ferroelectric film resistivities of greater than $10^{10}$ Ω-cm, and sufficient retention characteristics.

Titanium nitride is another obvious choice for a barrier layer, especially since it is already widely used in the semiconductor industry as a diffusion barrier. Unfortunately, TiN oxidizes at about 500° C., which is much lower than the optimum process temperature for ferroelectric materials. To overcome the shortcoming of the TiN in terms of temperature, platinum and iridium (Ir) have been used as materials for protective layers. Another common approach is to dope TiN with Al to form (Ti, Al)N or to use silicides or other complex structures. The most common approaches being currently explored use a combination of at least two layers to create a composite barrier layer, such as that in FIG. 1. Taking the PZT ferroelectric material as an example, one approach uses the combination of (Ti, Al)N/(Pt, Ir) as the composite barrier. The structure of FIG. 1 uses a special case of this composite barrier.

However, the above structure presents continuing problems. Even though platinum is a refractory metal and does not oxidize, it is nonetheless fairly porous to oxygen. That is, it does not prevent oxygen from diffusing to the underlying silicon plug and oxidizing a resistive surface layer there. Furthermore, such devices have been observed to suffer fundamental reliability problems. For example, if the test capacitors are repeatedly cycled for more than $10^7$ to $10^8$ bipolar cycles, the amount of remanent polarization still available becomes progressively smaller, and eventually the non-volatile capacitor functionally fails.

The use of platinum or iridium in the barrier or other parts of the stack structure presents other technological and strategic problems. First, dry etching of Pt or Ir is still very difficult although there have been some recent breakthroughs. A dry etch process, such as reactive ion plasma etching, is considered to be essential for commercial memories to be manufacturable with high yield. Since both Pt and Ir are relatively inert (although Ir does form stable oxides), the ability to form volatile reaction species during dry etching appears to be severely limited. Secondly, both Pt and Ir are considered to be precious metals, not only expensive but also of uncertain supply in such quantities required for widespread commercialization. As a result, the economics of supply and demand may impact the feasibility and dependability of using these precious metals in large quantities.

In view of the problems with platinum and iridium, one of the present inventors, Ramesh, and others have developed the use of other alloys and compounds that eliminate the need for including these precious metals. The results have been scientifically interesting and offer much promise. Dhote et al. in U.S. Pat. No. 5,777,356 describe the use of intermetallic alloys as the conducting barrier layer, without the use of Pt or Ir. An intermetallic alloy is typically composed of two refractory metals in relative compositions that are stoichiometric or nearly so. This approach has been shown to be effective with a Ti/Al-based intermetallic alloy directly contacting the polysilicon plug. A metal oxide, lanthanum strontium cobaltate (LSCO) is used as the lower electrode since it has been observed to provide some crystallographic templating for the overgrown PZT ferroelectric. However, the templating is effective only for the out-of-plane orientation, and the in-plane orientation is polycrystalline in a pattern which may be characterized as a mosaic crystal or (001) fiber-textured material.

Ramesh has also suggested another approach in U.S. Pat. No. 5,270,298 in which a barrier layer of ytrria-stabilized zirconia (YSZ) is overlaid by a strongly templating layer of an anisotropic perovskite such as bismuth titanate before the LSCO electrode is deposited. The templating layer controls the crystallographic orientation and assures the phase stability of the over grown cubic LSCO perovskite layer. This approach has proven very effective, but it requires the deposition of two different layers, namely the buffer and templating layers.

Non-volatile memories relying upon ferroelectric capacitors are generally used in a mode requiring traversing the hysteretic loop during every read or write operation, hence their designation of destructive read-out memories (DROs). A resulting problem, termed fatigue, often limits the operation of non-volatile ferroelectric memories to a large but limited number of read/write cycles, after which the hysteric loop turns more resistive with reduced separation between the two memory states. The problem of fatigue has in large part been overcome through either of two approaches, either using conductive metal oxide electrodes which templates the overlying material into a crystalline phase or replacing the PZT with another ferroelectric material, strontium bismuth titanate (SBT). However, the templating provided by conductive metal oxides such as LSCO is incomplete, and the resulting PZT is only (001)-textured. This can be overcome by use of additional layers, such as YSZ or bismuth strontium titanate (BST), but the number of required deposition steps is increased, and the monocrystallinity of the PZT is still not guaranteed. On the other hand, SBT is disadvantageous.

Ramesh et al. have recently disclosed a different approach for a related structure in U.S. Pat. No. 6,432,546, incorporated herein by reference in its entirety. In this process, a layer of (Ba, Sr)TiO$_3$ is grown on a crystalline silicon wafer. The preferred composition is strontium titanate (SrTiO$_3$ or simply STO), which is grown under conditions that the strontium titanate is grown to be epitaxial to the silicon, that is, monocrystalline, and the subsequently deposited LSCO and PZT are also monocrystalline. FIG. 2 shows a hysteresis curve 50 for polycrystalline PZT, hysteresis curve 52 for (001)-textured PZT, and hysteresis curve 54 for epitaxial and monocrystalline PZT grown on strontium titanate that is epitaxially grown on monocrystalline silicon according to the method of the afore cited patent application to Ramesh et al. Clearly, epitaxial PZT shows the best behavior with both the saturation and remanent polarization increasing with crystallinity. X-ray diffraction data verify the crystalline states of the samples, as described above.

However, strontium titanate cannot be simply added to the memory cell structure of FIG. 1 since strontium titanate is a dielectric or at best a semiconductor, having a room temperature resistivity of somewhat more than 1 $\Omega$-cm, which for a 100 nm or even 1 $\mu$m square conduction path amounts to a small strontium titanate capacitor in series with a large PZT capacitor so that a substantial part of the entire voltage drop is across the parasitic STO capacitor. As a result, the use of an STO barrier requires providing another current path into the lower capacitor electrode than through the underlying silicon. The memory cell structure illustrated in the afore cited patent application to Ramesh et al. includes a separate top contact to the bottom LSCO electrode providing a conductive path that avoids the STO layer.

It would be greatly desired to provide a barrier layer over silicon that is epitaxial to silicon and is also electrically conductive.

It would be also desired to extend the concepts of templating STO layers to other classes of devices and to improve upon the known types of STO templating.

SUMMARY OF THE INVENTION

According to an underlying aspect of the invention, a conductive barrier layer is formed between a silicon substrate, preferably a crystalline one, and a perovskite functional layer, such as part of a ferroelectric device. The conductive barrier layer may be composed of various materials, the most intensively studied of which are those composed of doped strontium titanate. The doping may be effected by substitution of one of the cations, whether of the larger strontium cation by, for example, lanthanum or of the smaller titanium cation by, for example, niobium, tantalum, or tungsten or possibly molybdenum or rhenium. Other doping constituents are possible. Instead of lanthanum, a dopant of another member of the lanthanide series, bismuth, antimony, or yttrium may be used. Alternatively, the strontium titanate may be deficient in oxygen, that is, anionically deficient. Other conductive barrier materials are available, for example, of the structural perovskite ABO$_3$ or of the perovskite-related structural families of the Ruddlesen-Popper phases A$_{n+1}$B$_n$O$_{3n+1}$. A preferred maximum resistivity is 0.01 $\Omega$-cm.

According to one aspect of the invention, the large strontium cation is substituted by lanthanum to form a conductive barrier layer of (La, Sr)TiO$_3$ between a silicon under layer and a functional metal oxide layer, such as a ferroelectric device. Preferably, the silicon underplayed is monocrystalline and the barrier layer acts as a template so that the functional metal oxide layer and any intermediate metal oxide electrode layers form epitaxially to the silicon underplayed. Yttrium and metal of the lanthanide group may also be substituted.

According to a second aspect of the invention, the small titanium cation is substituted by niobium, tantalum, or tungsten to form a conductive barrier layer of, for example, $(Sr, Ba)(Ti, Nb, Ta, W)O_3$ between a silicon underplayed and a functional metal oxide layer. Other metals may also be substituted.

According to a third aspect of the invention, strontium titanate or similar metal oxide is made deficient in oxygen to form a conductive barrier layer.

Any of the above three aspects of the invention may be combined.

Strontium ruthenate ($SrRuO_3$) and some other cubic perovskite are other materials to form a conductive barrier and template layer.

According to fourth aspect of the invention, a barrier layer of $(Sr, Ba) (Ti, Nb, Ta, W)O_3$ or $(La, Sr)TiO_3$, or a combination thereof, which is not necessarily conductive and may include $SrTiO_3$ is used as a templating barrier for the growth of monocrystalline functional metal oxide films used for both non-volatile ferroelectric memories and for other applications.

According a fifth aspect of the invention, the composition of the $(La, Ca, Sr, Ba) (Ti, Nb, Ta, W)O_3$ film is chosen to be lattice matched to silicon. Other related compositions may also be used.

According to a sixth aspect of the invention, an epitaxial metallic layer is grown between the silicon underplayed and the conductive barrier layer and may include either an intermetallic alloy or a silicide or a silicide and matching metal oxide.

The invention is particularly useful in which the conductive barrier electrically connects the underlying silicon to an electrode layer, the functional metal oxide layer is formed over the electrode layer and both the electrode layer and the functional oxide layer are epitaxial to the underlying silicon. A commercially important use is for a ferroelectric element, such as a memory cell in which the function oxide layer is a ferroelectric material and is overlaid with a second electrode layer.

DETAILED DESCRIPTION OF THE PREFERRED EMBODIMENTS

Strontium titanate ($SrTiO_3$), calcium titanate ($CaTiO_3$), barium titanate ($BaTiO_3$), and their combinational alloys may be characterized as wide band gap semiconductors having relatively high resistivities at room temperature. These materials are all part of the structural family of perovskites having a general formula $ABO_3$. As illustrated in the perspective view of FIG. 3, the crystal structure for $SrTiO_3$ as well as the other materials, is cubic with, for example, the small Ti atom or cation located at the center of the cubic cell, the large Sr atoms or cations located at the corners, and the O atoms or anions located at the face-centered positions. Calcium, strontium, and barium are Group IIA elements having a +2 oxidation state; Ti, a Group IVB element, has a +4 oxidation state; and, oxygen has a −2 oxidation state, thus accounting for the lack of free charge carriers in these materials. As a result, these materials, although usually characterized as dielectrics may also be characterized as wide-gap semiconductors. However, is it possible to doped these dielectric materials with charge donors or acceptors, just as is done with silicon. The cations Sr and Ti are the most easily doped constituents. The charge state for the Group IIA elements including Sr and some of their dopants are summarized in TABLE 1 and for Ti and some of its dopants are summarized in TABLE 2 together with their oxidation states, respective columns in the periodic table, and ionic radii.

TABLE 1

| | Charge State | Group | Ionic Radius (nm) |
|---|---|---|---|
| Ca | +2 | IIA | 0.099 |
| Sr | +2 | IIA | 0.112 |
| Ba | +2 | IIA | 0.135 |
| La | +3 | IIIB | 0.115 |
| Y | +3 | IIIB | 0.093 |
| Bi | +3 | VA | 0.120 |
| Sb | | VA | |

If lanthanum (La) is substituted for strontium in an alloy $Sr_{1-x}La_xTiO_3$, the alloy is no longer charge neutral because the lanthanum acts as an electron donor. Thereby, the doped strontium titanate changes from a resistive intrinsic semiconductor to a more conductive material, which may be characterized as a doped semiconductor. The size of the lanthanum ion is only a few percent larger than that of the strontium ion so that lanthanum doping introduces minimal stress and distortion. Alternatively, yttrium (Y) can be substituted for strontium to the same effect. The ionic radius of yttrium is less than that of strontium, so a mixture of lanthanum and yttrium can be used to dope strontium titanate with effectively no net stress.

Some recent experimental results for such substitution which is derived from our work is disclosed by Liu et al. in "Epitaxial La-doped $SrTiO_3$ on silicon: A conductive template for epitaxial ferroelectrics on silicon," *Applied Physics Letters*, vol 80, no. 25, 24 June 2002, pp. 4801–4803.

Figure 4:
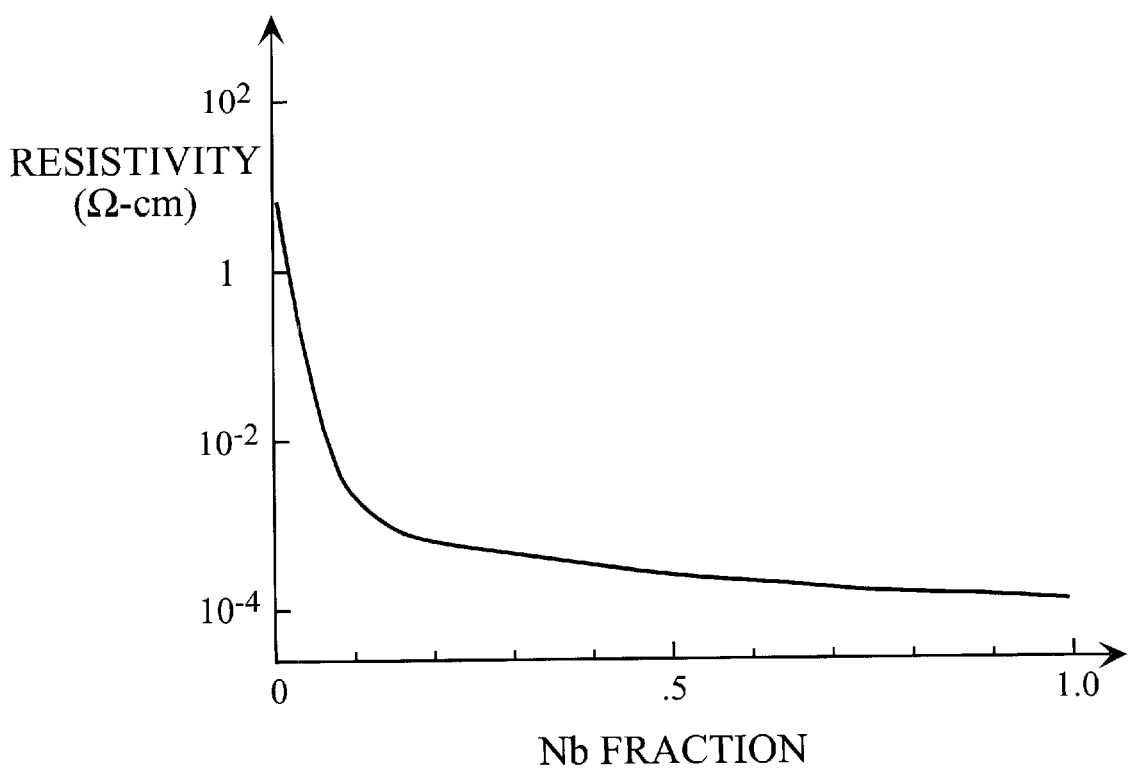
FIG. 4 is a graph of the dependence of resistivity on niobium doping fraction.

Similarly, if niobium is substituted for titanium, the niobium acts as an electron donor similarly increasing the conductivity of the doped material. Tomio et al. has characterized the crystallographic and electrical characteristics of the $SrTi_{1-x}Nb_xO_3$ alloy system in "Control of electrical conductivity in laser deposited $SrTiO_3$ thin films with Nb doping," *Japanese Journal of Applied Physics*, vol. 76, no. 10, Nov. 15, 1994, pp. 5886–5890. Pure $SrTiO_3$ shows a temperature dependence of its resistivity consistent with its being a semiconductor. On the other hand, $SrNbO_3$ shows a temperature dependence consistent with its being a metal. Its electrical resistivity as a function of alloying percentage x is shown in the graph of FIG. 4. Doping the strontium titanate with even 10% of Nb will significantly reduce the resistivity of the barrier film such that it can be considered conductive, particularly when the barrier thicknesses are in the range of 5 nm to a few hundreds of nanometers.

Although it may be possible for lanthanum to substitute for titanium to produce electron acceptors rather than donors, lanthanum almost always substitutes only for strontium. Lanthanum ions are much larger than titanium ions atom while being about the same size as strontium ions so that a lanthanum atom can only fit on the strontium site. For similar reasons, niobium substitutes almost exclusively for titanium. Although lanthanum and niobium may be equally effective as dopants, lanthanum has the advantage in deposition of thin films by molecular beam epitaxy (MBE) because it evaporates at a lower temperature.

Strontium titanate has a lattice constant (0.391 nm) that, when multiplied by 1.414 (square root of two), is only slightly larger than the silicon lattice constant (0.543 nm). As a result, a thin layer of $SrTiO_3$ can be grown epitaxially on (001)-oriented silicon by having its (001) axis aligned with the (011) axis of silicon. As shown by Tomio et al., ibid., the lattice constant increases with niobium doping, as would be expected since the ionic radius of niobium is greater than that of titanium so that the pseudomorphic thickness of niobium substituted strontium titanate of which excessive stress builds up is reduced.

Therefore, the lattice constant of $SrTi_{1-x}Nb_xO_3$ becomes progressively larger than the (110) lattice spacing of Si for increasingly larger niobium fractions x. However, for the thin films contemplated for integrated circuits, lattice matching is not considered essential.

Vanadium has been suggested as a dopant with a favorable ionic radius. However, V:$SrTiO_3$ has not yet been observed to be conductive, and it appears that vanadium doping produces a deep level in the strontium titanate.

These compositions can be further generalized. For the strontium-substitution, lanthanum can be generalized to the lanthanide group Ln, where Ln is one or more of La and the lanthanide series including cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu). Promethium is excluded from the lanthanide series because of its radioactivity. All these elements manifest a +3 oxidation state and thus can act as electron donors when substituted for strontium, and they all have ionic radii similar to that of lanthanum. Nonetheless, La is the preferred member of the lanthanide series because of its wide use and availability.

Another Group IIIB dopant for strontium substitution is yttrium (Y), which possesses the requisite charge state and shallow doping level. Furthermore the Group VA elements bismuth (Bi) and antimony (Sb) provide active dopants when substituting for strontium. Nonetheless, Y, Bi, and Sb have not been as well characterized as has La for Sr substitution.

Some of these dopants have been recognized as increasing the conductivity of strontium titanate. For example, Bum et al. in "Dielectric Properties of Donor-Doped Polycrystalline $SrTiO_3$," *Journal of Materials Science*, vol. 17, 1982, pp. 3510–3524 have recognized Bi, Sb, Nb, Ta, W, and the lanthanides as donor dopants increasing the conductivity of $SrTiO_3$. However, not all dopants increase conductivity because many form deep energy levels far removed from the edges of the band gap. Dopant ions are preferred which have similar size as the ion that is being replaced, resulting in the least strain of the parent structure, and which have higher valences than the element being replaced, that is, donor dopants.

For the strontium substitution, the lanthanide or other doping fraction x is greater than zero and is typically in a range of 5 to 50%. It is understood that the various doping fractions are essentially zero whenever they are less than 1%. The lanthanide doping fraction x may typically be in the range of 5% to 50%. If the doping is increased to 10 at % or more, the material is increasingly characterized as a metal. Doping fractions x of greater than 30% present solubility problems since the lanthanum tends to precipitate.

For the titanium substitution, niobium is the most preferred dopant, but another Group VB dopant, as tabulated in TABLE 2 is tantalum (Ta) having similar though less well characterized effects. Elements in other groups of the periodic table may be also used. The Group VIB elements tungsten (W) and molybdenum (Mo) can contribute two extra electrons when substituted for Ti. The Group VIIB element rhenium (Re) may also be used. Of these additional elements, W and Ta are less preferred than Nb while Mo and Re are least preferred though still acceptable in some situations.

TABLE 2

| | Charge State | Group | Ionic Radius (nm) |
|---|---|---|---|
| Ti | +4 | IVB | 0.068 |
| Nb | +5 | VB | 0.070 |
| Ta | +5 | VB | 0.073 |
| W | +6 | VIB | 0.068 |
| Mo | +6 | VIB | 0.062 |
| Re | +7 | VIIB | |

For all these dopants, the titanium substitution y may typically be between 5% and 50%. Substantially metallic behavior is observed for at least 10 at % alloying, but above 30 at % doping with La presents solubility problems.

However, it has been observed that complete substitution with ruthenium to produce $SrRuO_3$ results in a conductive oxide that bonds well with silicon. Other possible examples of complete substitution include $SrVO_3$, $SrCrO_3$, $SrMoO_3$, $LaNiO_3$, $SrFeO_3$, $SrRhO_3$ as well as $CaRuO_3$. A technique for epitaxially growing $SrRuO_3$ and other Ruddlesden-Popper homologous series on silicon substrates has been disclosed by Haeni in his thesis "Nanoengineering of Ruddlesden-Popper Phases Using Molecular Beam Epitaxy," etd-0712103-001200, available at Pennsylvania State University.

Furthermore, substitution for both cations is possible to produce a substituted alloy $(Ln_xSr_{1-x})(Ti_{1-y}M_y)O_3$, where Ln and M are defined above with a larger group corresponding to Ln being understood to operationally include B, Sb, and Y. This more complex alloying can be used to further increase the electrical conductivity while still maintaining lattice matching to silicon. The compositions given for these perovskite metal oxides need not be precise. It is also well known that these perovskite materials can be substantially deficient in oxygen from the indicated $O_3$, for example, an oxygen content above $O_{2.7}$, and still form as crystalline or polycrystalline materials. Furthermore, an oxygen deficiency z of between 0.1 and 0.5 can be used to increase the conductivity by introducing electron traps or hole donors. Accordingly, a yet more general composition is $La_xSr_{1-x}Ti_{1-y}(Nb, V, Ta)_yO_{3-z}$.

The barrier layer needs to be conductive to allow current to pass from the silicon substrate to the bottom electrode of the ferroelectric capacitor or other functional device. The total resistance of the barrier decreases with the barrier thickness and with the area of the barrier, and the minimum permitted resistance R is determined by the RC time constant of the device being less than the desired switching time. However, for the ferroelectric memory cells being contemplated and for reasonable barrier sizes and thicknesses, the barrier resistivity is preferably less than more 0.01 Ω-cm, and more preferably less than $10^{-3}$ Ω-cm.

Therefore, according to one aspect of the invention, a conductive metal oxide barrier layer is interposed between silicon and a functional metal oxide layer, perhaps with an intervening crystalline template layer to render the metal oxide layer epitaxial to underlying crystalline silicon. The metal oxide barrier layer is chosen to have a composition of $(Sr_{1-x}Ln_x)(Ti_{1-y}M_y)O_{3-z}$, where x and y have values between 5% and 50%, and z has a value of less than 50%, wherein Ln is one of more of the lanthanides, preferably La and possibly Y, Bi, or Sb, and M is Nb or possibly Ta, W, Mo, or Re. Preferably, the barrier layer and functional metal oxide layer are epitaxial to a silicon substrate, which may be polycrystalline but preferably is monocrystalline in the area of the device.

Figure 3:
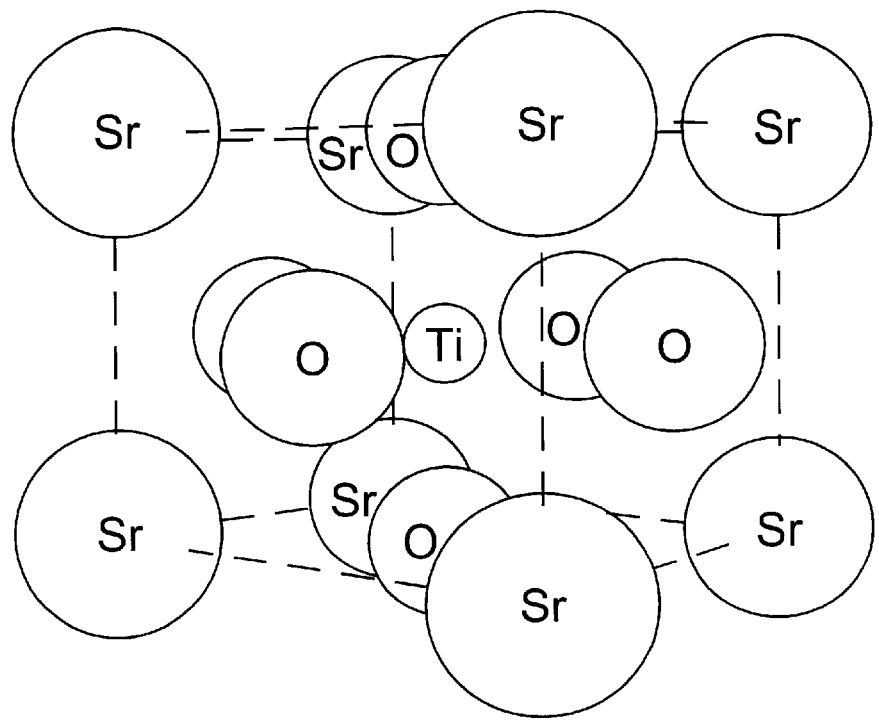
FIG. 3 is a perspective view of the crystal structure of strontium titanate.

The above listed materials have the general formula of $ABO_3$ and form in the perovskite structure illustrated in FIG. 3. Other conductive compositions of this same general formula include $CaVaO_3$, $LnVO_3$, $LnNbO_3$, $CaCrO_3$, $BaCrO_3$, $LnCrO_3$, $CaMoO_3$, $BaMoO_3$, $BaMnO_3$, $LnMnO_3$, $CaFeO_3$, $BaFeO_3$, $LnFeO_3$, $CaRuO_3$, $SrCoO_3$, $BaCoO_3$, $LnRhO_3$, $BaIrO_3$, $BaNiO_3$, $BaSnO_3$, and $SrPbO_3$. Other conducting perovskites include, when they are grown on thin (Ca, Sr, Ba)O buffer layers, compositions of $PbFeO_{2.5}$, $PbRuO_3$, $BiNiO_3$, and $PbSnO_3$. This compositions do not need to be doped to be conductive although doping may be beneficial.

Other groups of conductive barrier compositions are members of the structural series known as Ruddlesden-Popper phases in the general structural family $A_{n+1}B_nO_{3n+1}$. These structures are known to form for a large number of elements A and B as described, for example, by Landolt-Börnstein in *Numerical Data and Functional Relationships in science and Technology*, New Series, Group III, vol. 12a, eds. Hellwege and Hellwege (Springer-Verlag, 19778), pp. 126–206. Two groups are $Ca_{n+1}Ti_nO_{3n+1}$ for $n \geq 2$ and $Sr_{n+1}Ti_nO_{3n+1}$ for $n \geq 1$. Although n can in theory range to infinity, a practical upper limit is n=3 although it is noted that an infinite value of n corresponds to the perovskite $ABO_3$. These groups should be doped with substituents including Y, La, Ln, Nb, Ta, and W or with oxygen deficiencies, which are known to greatly increase conductivity in $SrTiO_3$. A related material needing doping is $BaTiO_3$.

Several more groups which do not necessarily requiring doping but may nonetheless benefit from it are $Ln_{n+1}Ti_nO_{3n+1}$, $Sr_{n+1}V_nO_{3n+1}$, $Sr_{n+1}Cr_nO_{3n+1}$, $Sr_{n+1}Mo_nO_{3n+1}$, $Ca_{n+1}Mn_nO_{3n+1}$, $Sr_{n+1}Mn_nO_{3n+1}$, $Sr_{n+1}Fe_nO_{3n+1}$, $Sr_{n+1}Ru_nO_{3n+1}$, $Ba_{+1}Ru_nO_{3n+1}$, $Ln_{n+1}Co_nO_{3n+1}$, $Sr_{n+1}Rh_nO_{3n+1}$, $Sr_{n+1}Ir_nO_{3n+1}$, $Ln_{n+1}Ni_nO_{3n+1}$, $Ln_{n+1}Cu_nO_{3n+1}$, $Sr_{n+1}Sn_nO_{3n+1}$, $Ba_{n+1}Sn_nO_{3n+1}$, and $Ba_{n+1}Pb_nO_{3n+1}$, where $n \geq 1$ but more typically $1 \leq n \leq 3$.

The above Ruddlesden-Popper groups are summarized by the pairs of cations listed in TABLE 3.

TABLE 3

| | |
|---|---|
| Sr | Ti, V, Cr, Mo, Mn, Fe, Ru, Rh, Ir, Sn |
| Ba | Ti, Ru, Sn, Pb |
| Ca | Ti, Mn |
| Ln | Ti, Co, Ni, Cu |

Figure 5:
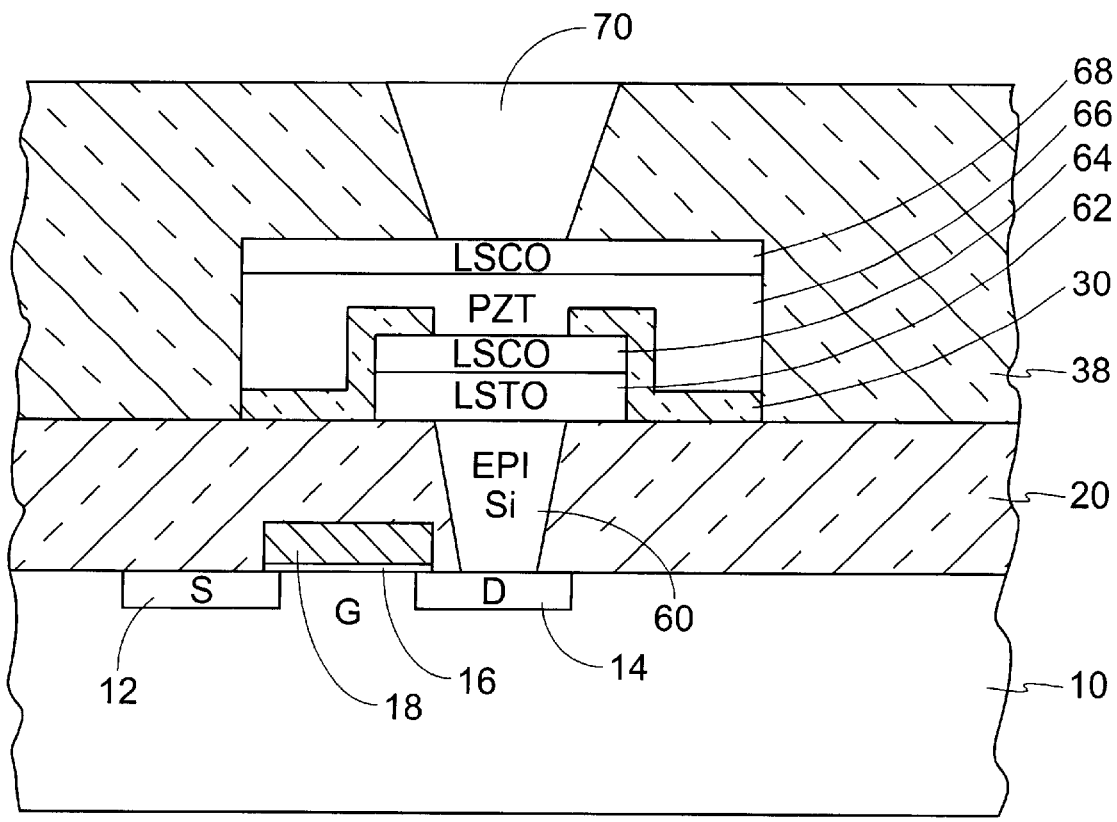
FIG. 5 is a is a cross-sectional view of a ferroelectric memory cell of a first embodiment of the invention using a doped barrier layer over a transistor drain, where the strontium of the strontium titanate barrier is substituted with lanthanum.

A ferroelectric memory cell utilizing the above effects is illustrated in the cross-sectional view of FIG. 5. A heavily doped epitaxial silicon plug 60 is grown by the method of selective epitaxial growth of silicon described by Chang et al. in *ULSI Technology* (McGraw Hill, 1996), pp. 131–134. The doping type of the silicon plug 60 is chosen to be that of the drain 12 to eliminate an Schottky barrier there between. The epitaxial silicon plug 60 provides both an electrical contact to the underlying drain 12 and an upward extension of the crystalline structure of the silicon substrate 10.

A thin monocrystalline barrier layer 62 is epitaxially formed over the crystalline silicon plug 60. The barrier layer 62 may be composed of lanthanum-substituted strontium titanate ($La_xSr_{1-x}$)$TiO_3$ or LSTO. An exemplary composition is $La_{0.17}Sr_{0.83}TiO_3$ having a thickness of between 3 and 50 nm, an exemplary thickness being about 20 nm. Good results have been obtained with substitution values x of between 8% and 33%. The epitaxial formation of the substituted strontium titanate layer 62 may be performed following the method of the afore cited U.S. patent application Ser. No. 09/624,527. However, a more complete method is described by McKee et al. in U.S. Pat. Nos. 5,225,031 and 5,830,270 and by McKee et al. in "Crystalline Oxides on Silicon: The First Five Monolayers," *Physical Review Letters*, vol. 81, no. 14, Oct. 5, 1998, pp. 3014–3017.

Figure 6:
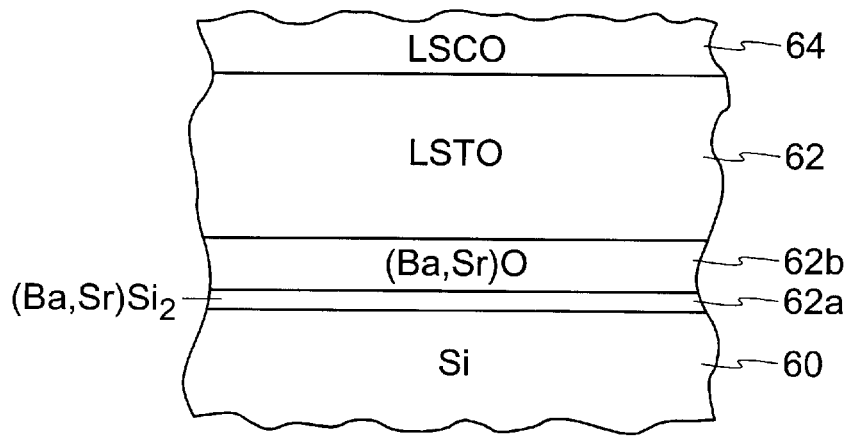
FIG. 6 is a cross-sectional view of the templating layer which may be used in the embodiment of FIG. 5.

The detailed process, as illustrated in the cross-sectional view of FIG. 6, involves depositing about a quarter to a half monolayer of strontium possibly including barium on a cleaned (001)-oriented silicon surface so that it forms an interface layer 62a of strontium disilicide ($SrSi_2$) or closely related material. This thickness corresponds to a strontium dose of 1.7 to $3.4 \times 10^{-14}$ cm$^{-2}$. Then, a thin template layer 62b is grown on the $SrSi_2$ layer 62a to have a composition of about $Ba_{0.72}Sr_{0.28}O$ with a lattice constant across its diagonal face matching the cubic silicon lattice constant. Thereafter, the conductive substituted strontium titanate film can be grown on the (BaSr)O to be epitaxial with the silicon. These depositions are preferably performed by molecular beam epitaxy (MBE) with growth temperatures in the range of 600 to 800° C. for (Ba, Sr)$Si_2$, 0° C. to 200° C. for (Ba, Sr)O, and 0° C. to 600° C. for doped $SrTiO_3$. Yu et al. in U.S. Pat. Nos. 6,241,821 and 6,224,669 have described this general type of process with a variant explanation of the structure of the interface layer.

The (BaSr)O material is not itself conducting in the bulk. However, if its thickness is kept to less than 2 nm, preferably less than 1 nm, current tunnels through the thin insulating oxide. Alternatively, the (BaSr)O or other templating material can be made electrically leaky so that for thin layers it adequately conducts between the silicon substrate and the substituted strontium titanate.

The use of strontium in the sub-monolayer interface layer 62a appears very beneficial because it forms strontium disilicide. This SrSi$_2$ layer 62a is typically crystalline and epitaxial to the underlying silicon. It not only provides an epitaxial template for the layers on top of it, but it also is a template that can withstand the introduction of oxygen for the growth of the overlying epitaxial oxide layers. Without this protective layer, the silicon would oxidize to SiO$_2$, resulting in two problems: (1) the loss of the crystalline template since SiO$_2$ is amorphous; and (2) the formation of an unwanted insulating layer between the silicon and the conductive metal oxide overlayer. Other intermediate layers possessing this protective attribute could also be use, for example, barium disilicide. The strontium-mediated growth of a conductive metal-oxide barrier and template layer applies also to the growth of LSCO.

Lanthanum substitution of SrTiO$_3$ in an epitaxial ferroelectric stack has been reported by the inventors' group in Liu et al., "Epitaxial La-doped SrTiO$_3$ on silicon: A conductive template for epitaxial ferroelectrics on silicon," *Applied Physics Letters*, vol. 80, no. 25, Jun. 24, 2002, pp. 4801–4803. With a lanthanum doping fraction x of 27%, the (La, Sr)TiO$_3$ layer and the two LSCO layers showed strong crystallinity.

Figure 7:
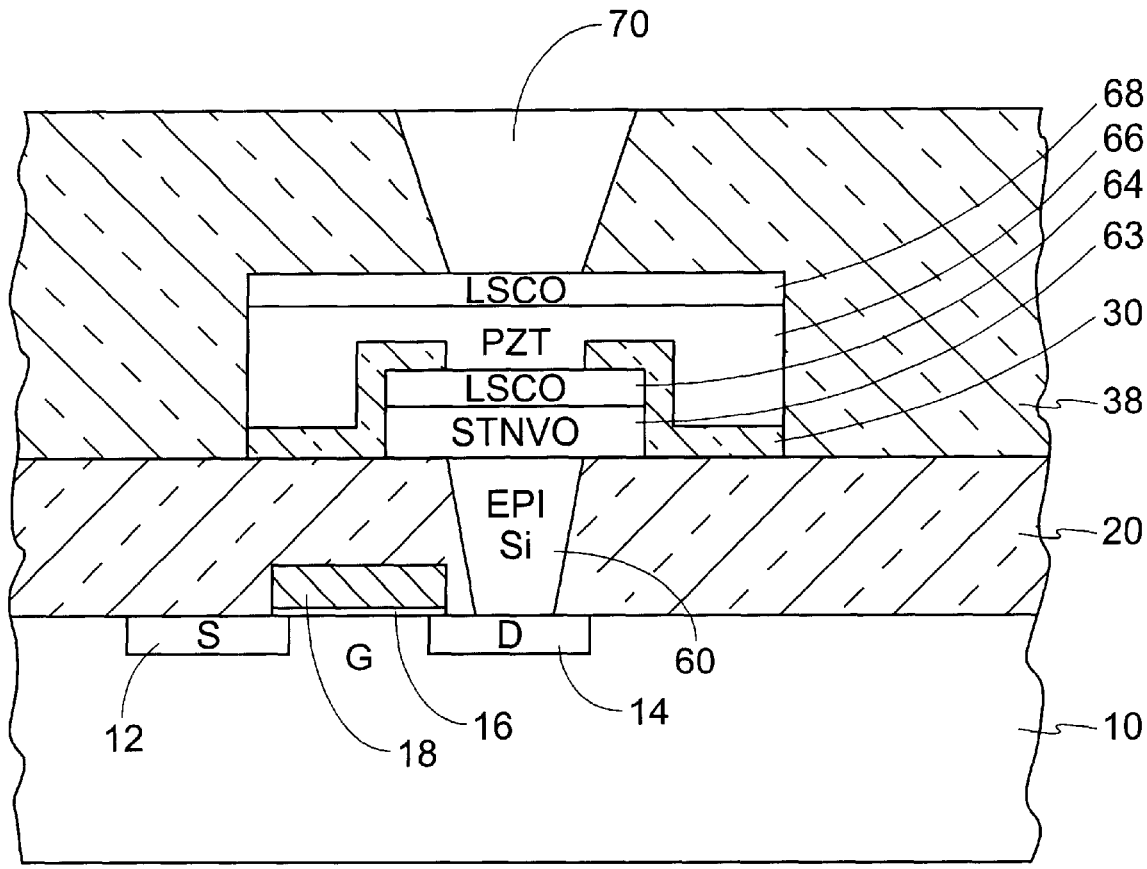
FIG. 7 is a cross-sectional view of a ferroelectric memory cell of a second embodiment of the invention similar to that of FIG. 5 but where the titanium of the strontium titanate barrier is substituted with niobium, tantalum, or tungsten.

Alternatively to the lanthanum substitution, as illustrated in the cross-sectional view of FIG. 7, a niobium- and tungsten-substituted strontium titanate (SrTi$_{1-x-y}$Nb$_x$W$_y$O$_3$ or STNWO) barrier layer 62 is epitaxially formed over the crystalline silicon plug 60 to a thickness of preferably 3 to 50 nm. For a conductive barrier, either x or y needs to be greater than zero and x+y should be no greater than one, preferably less than one, and more preferably less than 0.5.

Tantalum, although not directly addressed here, can be substituted into STNWO. Otherwise, the values of x and y need not be limited. Both doped SrTiO$_3$ and doped CaTiO$_3$ as well as Sr$_x$Ca$_{1-x}$TiO$_3$ may be used as conductive monocrystalline barriers. As mentioned above, x and y are advantageously chosen to provide lattice matching or near lattice matting of the alloy to crystalline silicon.

The approaches of FIGS. 5 and 7 can be combined so that the large strontium or calcium cations of strontium calcium titanate are substituted with lanthanum and the small titanium cations by niobium or tungsten. Further, an oxygen deficiency will also increase the conductivity of the barrier layer.

Lattice matching between the perovksite barrier and the underlying silicon is facilitated by using a combination of strontium and calcium in the doped perovskite layer. The plots of FIG. 8 display the cubic lattice constants a of the three perovskites BaTiO$_3$, SrTiO$_3$, and CaTiO$_3$ as a function of temperature. The figure also plots the lattice constant a of the semiconductors germanium and silicon divided by the square root of two. If the cubic edge of the perovskite is matched to the face diagonal of the semiconductor, these two so adjusted lattice constants should match. Below about 400° C., BaTiO$_3$ assumes various other phases (rhombic, orthorhombic, and tetragonal), thereby indicating a disadvantage of the use of BaTiO$_3$. While SrTiO$_3$ also assumes a rhombic below its Curie temperature of about 150° C., its room temperature strain when cooled from its cubic phase is acceptable. The figure shows that an alloying fraction x can be chosen for the undoped perovskite alloy Sr$_x$Ca$_{1-x}$TiO$_3$ at the growth temperature less than 700° C. such that the perovskite alloy is lattice matched to silicon. Although as the sample is cooled, the perovskite becomes tensilely strained, the barrier thin enough to prevent dislocations from forming.

Emphasizing the lattice matching, the more preferred doped compositions are based on the formula (Sr$_{1-w}$Ca$_w$)$_{1-x}$Ln$_x$Ti$_{1-y}$Nb$_{y-q}$W$_q$O$_3$, alternatively expressed as (Sr$_{1-w}$Ca$_w$)$_{1-x}$Ln$_x$Ti$_{1-y}$Nb$_{y-q}$W$_q$O$_3$. The alloying percentage w is used primarily for lattice matching. The large cation doping fraction x and the large cation doping fraction y (in the first expression) control the conductivity with effects at large fractions on the lattice matching. The split q of the large cation doping is a further optimization quantity. The most preferred composition includes (Sr, lattice matched to silicon at the perovskite crystallization temperature.

The width of the LSTO or STNWO barrier layer 62, 63 should not be much greater than the width of the crystalline silicon plug 60 because portions of the substituted STO barrier layer 62, 63 overhanging the field oxide 20 will have a much reduced tendency to form epitaxially with the silicon in the overhanging areas.

A perovskite metal oxide lower electrode layer 64 is epitaxially grown on the monocrystalline crystalline barrier layer 62, 63. The lower electrode layer 64 is preferably composed of lanthanum strontium cobaltate (La$_{1-x}$Sr$_x$CoO$_3$ or LSCO), where x is preferably about 50%. The LSCO deposition may be performed by sputtering at 450° C. If desired, a thin copper layer and a thin intermetallic alloy barrier layer (as described in U.S. Pat. No. 5,777,356) may be interposed between the LSTO barrier layer 62 and the lower electrode layer 64.

After the deposition and aperture patterning of the TiO$_2$ shaped barrier layer 28, a ferroelectric layer 66 is grown on the monocrystalline lower electrode layer 64. It may be composed of PZT or more generally Pb(La,Nb)Zr$_{1-x}$Ti$_x$O$_3$ (PLNZT) or yet other ferroelectric materials. The PZT deposition may be performed by sol-gel deposition cured at 450° C. At least in the regions of the barrier aperture over the monocrystalline LSCO lower electrode layer 62, the ferroelectric layer 66 can be deposited epitaxially and in monocrystalline form. An upper electrode layer 68 is grown over the ferroelectric layer 66, preferably in monocrystalline form over the central portion of the ferroelectric layer 66. It may be composed of LSCO, just as the lower electrode layer 64.

Figure 1:
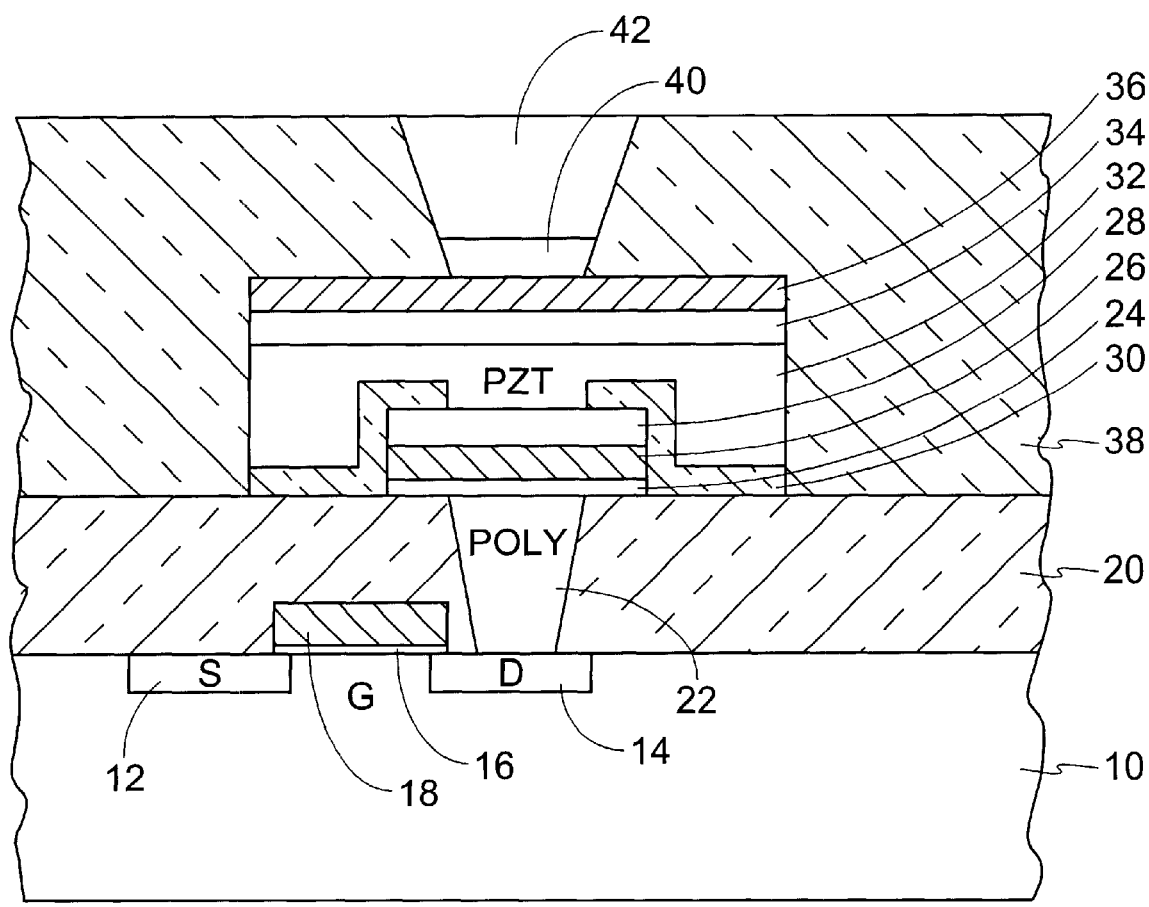
FIG. 1 is a cross-sectional view of a conventional ferroelectric memory cell.
Figure 2:
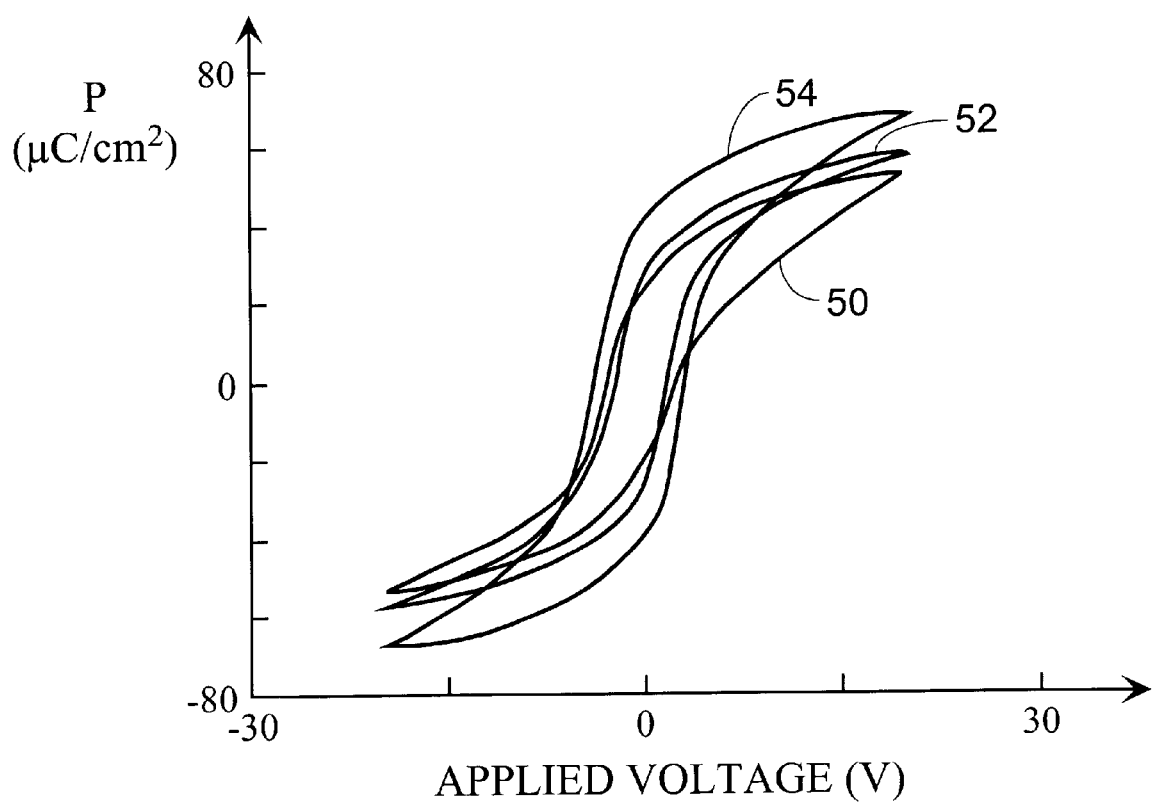
FIG. 2 is a graph showing the ferroelectric hysteresis curves for PZT in three different crystalline states.

Thereafter, the fabrication and the structure of the memory cell of FIG. 5 or 7 follows that of the prior art memory cell of FIG. 1 with a barrier plug 70 overlying the upper LSCO electrode layer 68. The barrier plug 70 preferably includes at least a barrier portion of platinum or an intermetallic alloy.

This memory cell structure provides both a conductive barrier and a monocrystalline ferroelectric layer with its attendant highly desirable hysteretic and fatigue characteristics. The ferroelectric and related materials are also usable as capacitor gap materials having a high dielectric constant. In this mode of operation, hysteresis is not required.

The above described process has been demonstrated using a barrier layer 62 composed either of lanthanum-substituted strontium titanate or of strontium ruthenate.

To benefit from the conductive barrier described above, the relatively thick silicon oxide layer of the Ramesh et al. patent application should be avoided by the use of, for example, a lower oxygen pressure during the substituted STO deposition or other process conditions. It has been determined that the silicon oxide layer is not inherently formed between STO and silicon using the general method of the patent application. Alternatively, as illustrated in the cross-sectional view of FIG. 8, a thin metallic barrier layer 70 is epitaxially formed over a monocrystalline silicon layer 72, such as the epi silicon plug 60 of FIG. 4, and the substituted LSTO layer 62 or STNVO layer 63 is epitaxially deposited on the monocrystalline metallic barrier layer 70. It is known that very thin layers of some metals can be epitaxially formed over silicon. Such a monocrystalline metallic layer provides a template for the subsequent epitaxial growth of the niobium and vanadium substituted strontium titanate and may also be used to prevent an appreciable amount of oxygen from reaching the silicon layer 72. The metal may be one of the intermetallic alloys of the Dhote et al. patent. Alternatively, the metallic barrier may be composed of a silicide, such as strontium silicide, barium silicide, titanium silicide, tungsten silicide, or tantalum silicide, formed by depositing a thin metal layer over the silicon and then subjecting the structure to rapid thermal processing (RTP). As described by Chang et al., ibid., pp. 395–406, this process is capable of nucleating monocrystalline titanium silicide when annealed at 700 to 750° C.

Other perovskite metal oxides may be used for one or both of the electrode layers, including strontium ruthenate and lanthanum nickelate. The non-perovskite metal oxides $RuO_2$ and $IrO_2$ have a low resistivity but generally do not provide the epitaxial growth desired for the electrode layers. The electrode layers may be deposited by chemical vapor deposition (CVD), sputtering, or pulsed laser deposition (PLD) at temperatures preferably in the range of 400 to 600° C. The ferroelectric layer may be deposited in the same temperature range by CVD, solgel, or sputtering.

Figure 8:
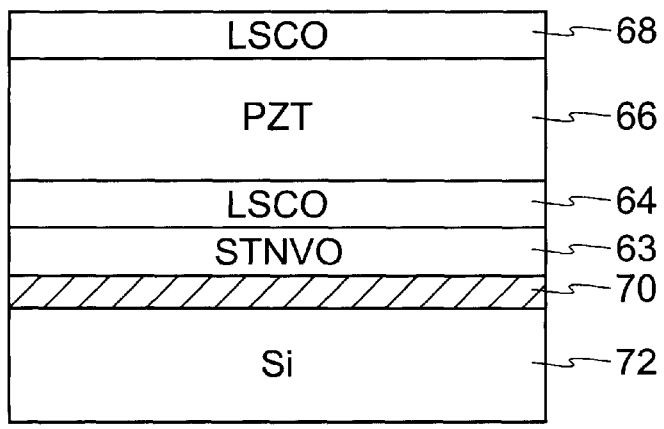
FIG. 8 is a cross-sectional view of a structure using an additional epitaxial metallic barrier between crystalline silicon and crystalline doped barrier layer.
Figure 9:
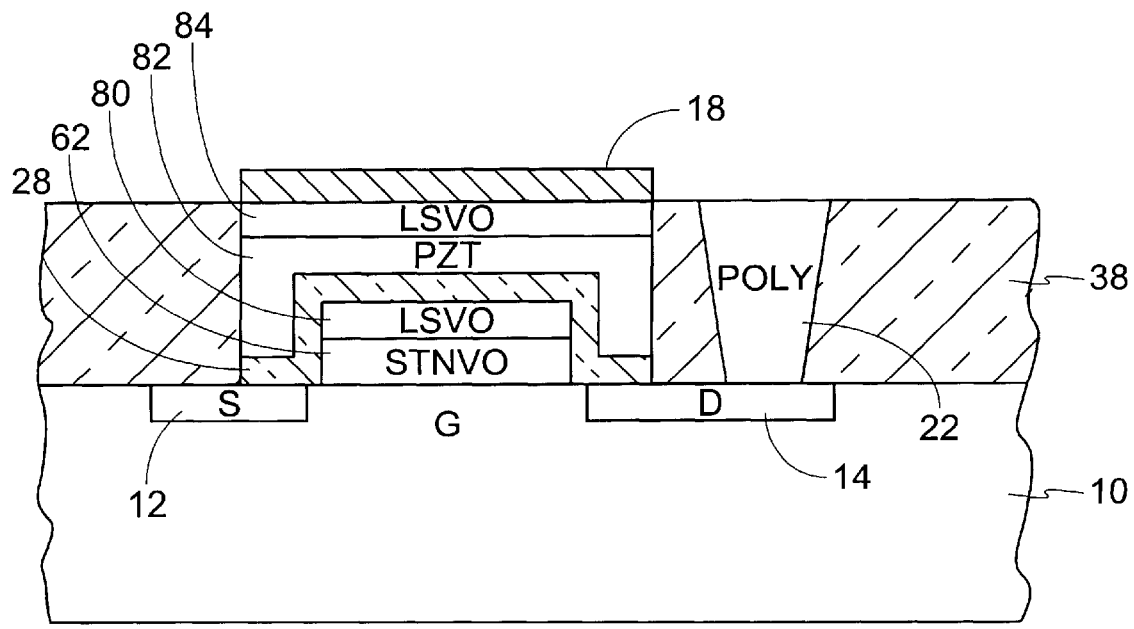
FIG. 9 is a cross-sectional view of a ferroelectric memory cell of a second embodiment of the invention using a doped barrier layer over a transistor gate.
Figure 10:
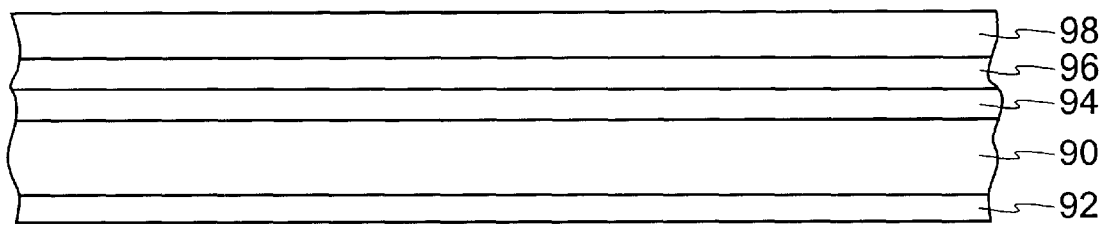
FIGS. 10 and 11 are two cross-sectional views of the formation of a micromachined electromechanical (MEM) device.

A second type of device utilizing the conductive barrier of the invention is a non-volatile field-effect transistor illustrated in cross-section in FIG. 8. This structure replaces the gate dielectric layer 16 of FIGS. 1, 5, and 7 with a ferroelectric stack including the monocrystalline $Sr(Ti, Nb, V)O_3$ conductive barrier 63 (or alternatively the LSTO barrier 62), a monocrystalline lower electrode layer 80 of lanthanum strontium vanadate ($La_{1-x}Sr_xVO_3$ or LSVO), a ferroelectric layer 82 of PZT or more generally PLNZT, and an upper electrode layer 84 of LSVO covered by the metallization 18. The LSVO is one of many conductive metal oxides that may be used in place of LSCO. The silicon plug 22 may be either polysilicon or epitaxial monocrystalline silicon. To prevent the conductive STNVO barrier layer 62 from shorting the source 12 and drain 14, the width of the lower section of the metal oxide stack should be no wider than the gate region G between the source 12 and drain 14. This structure has the effect of a floating gate that remains open or closed dependent upon the state of a non-volatile signal impressed on the ferroelectric stack and thereafter removed. That is, the structure provides a non-volatile gate on a transistor. Alternatively, the STNVO barrier layer 62 may be replaced with a LSTO barrier, as described with reference to FIG. 4.

The invention may be extended to structures not requiring a conductive barrier, in which case non-substituted $SrTiO_3$, can be effectively used as well. One such structure is a generic micromachined electro mechanical (MEM) device. As illustrated in the cross sectional view of FIG. 7, a silicon wafer 90 is coated on its back side with a hard mask layer 92 of silicon nitride ($Si_3N_4$) and on its front with a strontium titanate layer 94, possibly substituted with niobium or vanadium, a lower electrode layer 96 of, for example, LSCO, and a piezoelectric layer 98 of, for example, PZT or more generally PNLZT. The strontium titanate layer 94, electrode layer 96, and piezoelectric layer 98 are preferably all grown to be epitaxial to the monocrystalline silicon wafer 90. Additional layers may be grown over the piezoelectric layer 98 dependent on the type of MEM device that is desired. It is understood that a piezoelectric layer typically provides other electrically dependent characteristics, such as required for bolometric or thermoelectric devices.

Figure 11:
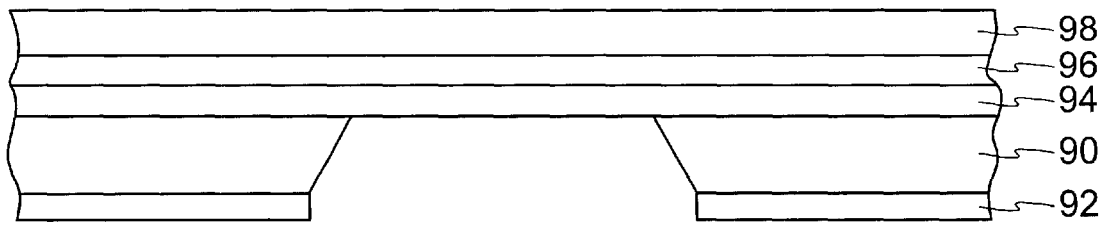

The hard mask layer 92 is photolithographically patterned, as illustrated in the cross-sectional view of FIG. 11 to form a mask aperture having a dimension of the order of 1 $\mu$m. Deep reactive ion etching (RIE) is then performed to completely etch through the silicon wafer 90 and to leave suspended a micrometer cantilever of the piezoelectric layer 98 and attached barrier layer 94 and lower electrode layer 96. Such a piezoelectric cantilever forms the core structure of a MEM device, and a monocrystalline piezoelectric cantilever offers increased performance and reliability. It is appreciated that the MEM device achievable is not limited to the simple illustrated structure. Other sequences of functional metal oxide layers are possible, particularly in combination with a piezoelectric layer. In some applications, the cantilever extends only part way across the underlying aperture, for example, providing a deflecting arm. The aperture also may be formed from the front side of the wafer by isotropically etching the silicon layer wafer 90 (which is much thicker than illustrated) around a masked portion of the metal oxide layers 94, 96, 98 so as to undercut the metal oxide layers and leaving the masked portion cantilevered from one or both sides of the aperture extending only part way through the silicon wafer 90.

The invention is not limited to the described ferroelectric memories and piezoelectric MEMs. Many other devices achievable with the invention are briefly tabulated in TABLE 4.

TABLE 4

| Use | Layer-1 | Layer-2 | Layer-3 | Layer-4 |
|---|---|---|---|---|
| Non-volatile Memories | STNVO | LSCO<br>LSVO<br>$RuSr_{1-x}Ca_xO_3$<br>$CrLa_{1-x}Sra_xO_3$<br>$NiLa_{1-x}Sra_xO_3$ | PLNZT | LSCO<br>LSVO<br>$RuSr_{1-x}Ca_xO_3$<br>$CrLa_{1-x}Sra_xO_3$<br>$NiLa_{1-x}Sra_xO_3$ |
| FETs | STNVO | LSVO | PLNZT | LSVO |
| Pyroelectric IR Sensors | STNVO | $RuSr_{1-x}Ca_xO_3$<br>$CrLa_{1-x}Sra_xO_3$<br>$NiLa_{1-x}Sra_xO_3$<br>LSCO, LSVO | PLNZT | $RuSr_{1-x}Ca_xO_3$<br>$CrLa_{1-x}Sra_xO_3$<br>$NiLa_{1-x}Sra_xO_3$<br>LSCO, LSVO |
| Piezoelectric MEMs | STNVO | $RuSr_{1-x}Ca_xO_3$<br>$CrLa_{1-x}Sra_xO_3$<br>$NiLa_{1-x}Sra_xO_3$<br>LSCO, LSVO | PLNZT | $RuSr_{1-x}Ca_xO_3$<br>$CrLa_{1-x}Sra_xO_3$<br>$NiLa_{1-x}Sra_xO_3$<br>LSCO, LSVO |
| SFRAM | STNVO | LSCO | PLNZT | $In_2O_3$; $SnO_2$ |
| Optical Devices | STNVO<br>STNVO<br>STNVO | PLNZT<br>$LiNbO_3$<br>$Bi_4Ti_3O_{12}$; BST; SBNT | | |
| BST, DRAMs | STNVO | LSCO | $TiBa_{1-x}Sr_xO_3$ | LSCO |
| Decoupling Capacitors | STNVO | $RuSr_{1-x}Ca_xO_3$<br>$CrLa_{1-x}Sr_xO_3$<br>$NiLa_{1-x}Ba_xO_3$ | $TiBa_{1-x}Sr_xO_3$ | $RuSr_{1-x}Ca_xO_3$<br>$CrLa_{1-x}Sr_xO_3$<br>$NiLa_{1-x}Ba_xO_3$ |
| Uncooled IR Sensor | STNVO | $MnLa_{1-x}Ca_xO_3$<br>$MnLa_{1-x}Ba_xO_3$ | | |
| Bolometer, Pyrometer | STNVO | MRCSBO | PLNZT | MRCSBO |
| Tunnel Junction | STNVO<br>STNVO | MRCSBO<br>$Fe_3O_4$ | $TiBa_{1-x}SrO_3$ | MRCSBO |
| Spin Valve | STNVO | MRCSBO | $TiBa_{1-x}SrO_3$ | MRCSBO |

TABLE 4-continued

| Use | Layer-1 | Layer-2 | Layer-3 | Layer-4 |
|---|---|---|---|---|
| Microwave Ferrite on Si | STNVO | $AB_2O_4$ | | |
| Barrier | STNVO | Ti(Al)N | | |
| Metal | STNVO | Pt, Ir, Fe, Cu, Ni, Co | | |
| High-Temp. Superconductor | STNVO | YBCO, BSCCO | | |
| Thermoelectric | STNVO | $TiBa_{1-x}La_xO_3$ | | |
| | STNVO | MRCSBO | | |

In this table, SFRAM is static ferroelectric ram; BST is bismuth strontium titanate; DRAM is dynamic random access memory: CMR stands for colossal magneto resistance, a class of magneto resistive materials used in magnetic read heads; MRCSBO stands for $MnRE_{1-x}(Ca, Sr, Ba)_xO_3$ where RE represents the rare earth elements including lanthanum (La) through lutetium (Lu) in the periodic table and the presence of Ca, Sr, Ba may be in a range of fractions including zero that sum to one; YBCO is yttrium barium copper oxide and BSCCO is bismuth strontium calcium cuprate, both cuprate high-temperature superconductors. It is noted that the alloying percentages in the table are not limited so that, for example, $RuSr_{1-x}Ca_xO_3$ includes $SrRuO_3$ and $NiLa_{1-x}Sr_xO_3$ includes LaNiO3. The above listed materials, such as perovskite ferromagnetic oxide (both magnanites and ferrites), spinel ferrites, perovskite thermoelectrics, etc. can all be deposited on the surfaces of STNVO (including STO) to create novel devices with improved characteristics. All these oxide materials are functional metal oxide providing electrical characteristic other than electrical resistivity that can be advantageously employed in many classes of devices. These oxide materials can all be characterized as dielectrics having an electrical resistance significantly higher than that of the conductive metal oxides such as LSCO, etc. Most of these materials are multi-component (multi-metal) oxides, although a few have only a single metal component. The invention, however, can be advantageously applied to generic metals and barriers such as Ti(Al)N.

The magnetic perovskites have the same or nearly the same crystal structure as LSCO or STO. These materials, especially those in which the magnetic species is manganese, show very interesting temperature dependence of the magnetic properties together with a metal-insulator phase transition. Their transport properties are strongly dependent on magnetic and electric fields, that is, the colossal magneto resistance or electro resistance effects. The fact that they are very similar in crystal structure and chemistry to other perovskites such as STO, NbSTO, etc. means that lattice matched heterostructures can be built in combination with other perovskites, as appropriate for the device. One such device is a spin valve including a trilayer of a ferromagnet, metal, and ferromagnetic. Another such device is a magnetic tunnel junction including a trilayer of a ferromagnet, insulator, and ferromagnet.

These magnetic perovskites can also be used in bolometric applications, that is, applications in which a change in temperature is sensed as a change in resistance. Bolometry benefits from the large change in resistance at the metal-insulator transition of the magnetic perovskites. A thin film of such a material can then sense radiation, for example, infrared radiation, through a change of its temperature dependent resistance. At the peak of the plot between resistance and temperature, magnetic perovskites can show temperature coefficients of resistance ($dR/dT \div R$) of 5 to 18%. For comparison, vanadium oxide which is currently used as a bolometric sensors shows a value of 2.5%. Epitaxial films of the magnetic perovskites formed over silicon are very desirable.

Microwave spinels are oxide compounds of the general formula $AB_2O_4$. The A species is typically a metal species having a +2 oxidation state, such as Mn, Mg, Zn, etc. The B species is typically a metal having a +3 oxidation state, such as Fe. A typical microwave spinel compound is $Fe_3O_4$, in which the iron manifests both oxidation states. Spinels have crystal structures that are similar to that of perovskites since the oxygen sub-lattice in the these compounds has the octahedral symmetry that is present in the perovskites. The magnetic spins are typically insulators and have very low coercive fields, of the order of 0.1 to 1.0 oersted, and therefore used in microwave applications.

Many of the advantages of the invention can also be enjoyed with a mixture of barium (Ba) and strontium for the primary metal, as was noted in the Ramesh et al. patent application.

It is understood that the qualifications of epitaxial growth and monocrystalline structure does not preclude the incidence of a normal degree of defects, including slip planes, occurring in the materials as long as the overall crystallinity and semiconductor properties are not affected on the scale of the final devices.

What is claimed is:

1. A functional metal oxide structure, comprising:
a crystalline silicon layer;
a first metal oxide layer epitaxially formed over said silicon layer and comprising
a conductive metal oxide chosen from the group consisting of $ABO_3$ and $A_{n+1}B_nO_{3n+1}$, doped substituents thereof, and oxygen deficient versions thereof and having an electrical resistivity of less than 0.01 $\Omega$-cm; and
a second metal oxide layer epitaxially formed over said first metal oxide layer.

2. The structure of claim 1, wherein A comprises at least one of calcium, barium, and strontium.

3. The structure of claim 2, wherein A comprises lanthanide substituents for said calcium, barium, and strontium to a doping fraction of between 5 and 30%.

4. The structure of claim 2, wherein A comprises substitutents for said calcium, barium, and strontium selected from the group consisting of Bi, Sb, and Y to a doping fraction of between 5 and 50%.

5. The structure of claim 1, wherein B comprises titanium.

6. The structure of claim 1, wherein said B comprises titanium and at least one metal substituent therefor selected from the group consisting of Nb, Ta, Mo, W, and Re to a doping fraction of between 5 and 50%.

7. The structure of claim 6, wherein said group consists of Nb, Ta, and W.

8. The structure of claim 7, wherein said group consists of Nb.

9. The structure of claim 1, wherein said $ABO_3$ and $A_{n+1}B_nO_{3n+1}$, are selected from the group consisting of $SrTiO_3$, $CaVaO_3$, $LnVO_3$, $LnNbO_3$, $CaCrO_3$, $BaCrO_3$, $LnCrO_3$, $CaMoO_3$, $BaMoO_3$, $BaMnO_3$, $LnMnO_3$, $CaFeO_3$, $BaFeO_3$, $LnFeO_3$, $CaRuO_3$, $SrCoO_3$, $BaCoO_3$, $LnRhO_3$, $BaIrO_3$, $BaNiO_3$, $BaSnO_3$, $SrPbO_3$, $Ln_{n+1}Ti_nO_{3n+1}$, $Sr_{n+1}V_nO_{3n+1}$, $Sr_{n+1}Cr_nO_{3n+1}$, $Sr_{n+1}Mo_nO_{3n+1}$, $Ca_{n+1}Mn_nO_{3n+1}$, $Sr_{n+1}Mn_nO_{3n+1}$, $Sr_{n+1}Fe_nO_{3n+1}$, $Sr_{n+1}Ru_nO_{3n+1}$, $Ba_{n+1}Ru_nO_{3n+1}$, $Ln_{n+1}Co_nO_{3n+1}$, $Sr_{n+1}Rh_nO_{3n+1}$, $Sr_{n+1}Ir_nO_{3n+1}$, $Ln_{n+1}Ni_nO_{3n+1}$, $Ln_{n+1}Cu_nO_{3n+1}$, $Sr_{n+1}Sn_nO_{3n+1}$, $Ba_{n+1}Sn_nO_{3n+1}$, and $Ba_{n+1}Pb_nO_{3n+1}$, where $n \geq 1$.

10. The structure of claim 1, wherein said second metal oxide layer is a conductive first electrode layer and further comprising:
   a ferroelectric layer epitaxially formed on said first electrode layer; and
   a second electrode layer formed on said ferroelectric layer.

11. A functional metal oxide structure, comprising:
   a crystalline silicon layer;
   a first metal oxide layer epitaxially formed over said silicon layer comprising
      strontium titanate that is partially cationically substituted to be less resistive than said strontium titanate; and
   a second metal oxide layer epitaxially formed over said first metal oxide layer.

12. The structure of claim 11, wherein said first metal oxide layer has a resistivity of less than 0.01 Ω-cm.

13. The structure of claim 11, wherein said first metal oxide layer comprises substituents for strontium of said strontium titanate to a doping fraction of between 5 and 50%.

14. The structure of claim 13, wherein said substituents comprise elements selected from the lanthanide group, Bi, Sb, and Y.

15. The structure of claim 14, wherein said substituents comprise La.

16. The structure of claim 11, wherein said first metal oxide layer comprises metal substituents for titanium of said strontium titanate selected from the group consisting of Nb, Ta, Mo, W, and Re to a doping fraction of between 5 and 50%.

17. The structure of claim 11, wherein said second metal oxide layer is a first electrode layer and further comprising:
   a ferroelectric layer epitaxially formed over said second metal oxide layer; and
   a second electrode layer formed over said ferroelectric layer.

18. A functional metal oxide structure, comprising:
   a crystalline silicon layer;
   a second metal oxide layer epitaxially formed over said silicon layer and comprising $(N_xSr_{1-x})Ti_{1-y}M_yO_{3-z}$,
      wherein N is chosen form the group consisting of the lanthanides, Bi, Sb, and Y,
      wherein M is chosen from the group consisting of Nb, Ta, W, Mo, and Re,
      wherein at least one of x, y, and z is non-zero and all of x, y, and z are less than 0.5, and
      wherein said second metal oxide layer has an electrical resistivity of less than 0.01 Ω-cm; and
   a second metal oxide layer epitaxially formed over a first metal oxide layer.

19. The structure of claim 18, wherein at least one of x and y has a value of between 5% and 50%.

20. The structure of claim 18, wherein z has a value greater than 0.1.

21. The structure of claim 18, wherein N is La and y=0.

22. A non-volatile memory cell, comprising:
   a crystalline silicon underlayer;
   a conductive barrier layer formed over said underlayer comprising strontium titanate having at least one of its cations partially substituted with a lanthanide;
   a lower conductive metal oxide layer formed over said conductive barrier layer;
   a ferroelectric layer formed over said lower conductive metal oxide layer; and
   an upper conductive metal oxide layer formed over said ferroelectric layer.

23. The memory cell of claim 22, wherein said at least one cation is partially substituted to a fraction of between 5 and 50%.

24. The memory cell of claim 22, wherein a strontium cation is substituted by said at least one lanthanide.

25. The memory cell of claim 22, wherein no platinum layer is included between said ferroelectric layer and said silicon underlayer.

26. The memory cell of claim 22, wherein said upper and lower metal oxide layers comprise perovskite materials.

27. A non-volatile memory cell, comprising:
   a silicon underlayer;
   a conductive barrier formed on said crystalline silicon underlayer and comprising
      a first metal oxide selected from the group consisting of $SrRuO_3$, $SrVO_3$, $SrCrO_3$, $SrRuO_3$, $SrMoO_3$, $LaNiO_3$, $SrFeO_3$, $SrRhO_3$, and $CaRuO_3$;
   a lower conductive metal oxide layer formed over said conductive barrier layer;
   a ferroelectric layer formed over said lower conductive metal oxide layer; and
   an upper conductive metal oxide layer formed over said ferroelectric layer.

28. The memory cell of claim 27, wherein said silicon underlayer is crystalline and said conductive barrier, lower conductive metal oxide layer, ferroelectric layer, and upper conductive metal oxide layer are epitaxial to said silicon underlayer.

29. The memory cell of claim 28, wherein said first metal oxide comprises $SrRuO_3$.

30. A magnetic heterostructure device, comprising:
   a silicon substrate;
   a perovskite barrier layer comprising $(Ln, Sr)(Ti, Nb, W)O_3$ grown on said silicon substrate, where fractions of Ln and Sr may be any values summing to one and fractions of Ti, Nb, and W may be any values summing to 1;
   a first magnetic perovskite layer comprising $MnLa_{1-x}(Ca, Sr, Ba)_xO_3$ grown on said perovskite barrier layer;
   a perovskite separation layer grown on said first magnetic perovskite layer; and
   a second magnetic perovskite layer comprising $MnLa_{1-x}(Ca, Sr, Ba)_xO_3$ grown on said perovskite function layer;
   wherein fractions of Ca, Sr, and Ba in said first and second magnetic perovskite layers may have any values summing to 1.

31. The device of claim 30, wherein said perovskite separation layer is chosen to be one of a conductive or insulating layer to thereby form one of a spin valve and a magnetic tunnel junction device.

32. The device of claim 31, wherein said first and second magnetic perovskite layers and said perovskite separation layer are epitaxial to said silicon substrate.

* * * * *